United States Patent [19]
Nakamura

[11] Patent Number: 6,051,883
[45] Date of Patent: Apr. 18, 2000

[54] MANUFACTURING METHOD AND SEMICONDUCTOR DEVICE WITH LOW CONTACT RESISTANCE BETWEEN TRANSPARENT ELECTRODE AND PAD ELECTRODE

[75] Inventor: Kenichi Nakamura, Tokyo, Japan

[73] Assignee: NEC Corporation, Tokyo, Japan

[21] Appl. No.: 08/825,319

[22] Filed: Apr. 1, 1997

[30] Foreign Application Priority Data

May 16, 1996 [JP] Japan .................................. 8-121848

[51] Int. Cl.[7] .......................... H01L 23/48; H01L 23/52; H01L 29/76; H01L 29/94
[52] U.S. Cl. .......................... 257/768; 257/750; 257/774; 257/761; 257/763; 257/764; 257/377; 257/382; 257/383
[58] Field of Search ...................... 257/768, 750, 257/754, 755, 758, 761, 763, 764, 774, 377, 382, 383

[56] References Cited

U.S. PATENT DOCUMENTS 5,650,664  7/1997  Sakamoto ................................ 257/764

FOREIGN PATENT DOCUMENTS 1235334  9/1989  Japan .
4-326765  11/1992  Japan .
5210116  8/1993  Japan .
5-235360  9/1993  Japan .

OTHER PUBLICATIONS

T. Shimada et al.; "A Study of Poly-Si TFT LCD with Very Small Pixel Size and High Aperture Ratio"; Extended Abstracts of the 1991 International Conference on Solid State Devices and Materials, Yokohama, 1991, pp. 641–643.

Primary Examiner—Mahshid Saadat
Assistant Examiner—Jhihan B. Clark
Attorney, Agent, or Firm—Whitham, Curtis & Whitham

[57] ABSTRACT

In a semiconductor device such as a thin film transistor a semiconductor region is formed and an insulating film is formed on the semiconductor region to have a contact hole extending to the semiconductor region. An electrically conductive metal layer is formed of aluminum to fill the contact hole. An electrically conductive protection layer is formed on the metal layer to prevent oxidation of the metal layer during manufacturing of the semiconductor device. Material of the protection layer is more difficult to be oxidized than aluminum. A transparent electrode is formed on the protection layer such that the electrode is electrically connected to the semiconductor region. The protection layer may be formed of titanium or a laminate layer of a titanium layer and a titanium nitride layer.

10 Claims, 6 Drawing Sheets

MANUFACTURING METHOD AND SEMICONDUCTOR DEVICE WITH LOW CONTACT RESISTANCE BETWEEN TRANSPARENT ELECTRODE AND PAD ELECTRODE

BACKGROUND OF THE INVENTION

1. Field of the Invention

The present invention relates to a semiconductor device and a manufacturing method for the same, and more particularly to a semiconductor device suitable for a liquid crystal display device, an image sensor and so on, and a manufacturing method for the same.

2. Description of Related Art

As the method which drives a liquid crystal display device to display an image, there are conventionally known a simple matrix method and an active matrix method. In the simple matrix method, a display pixel is driven by the voltage which is applied between a scan electrode and a signal electrode provided in an orthogonal manner to the scan electrode On the other hand, in the active matrix method, a switching element is provided in an intersection point of a scan electrode and a signal electrode and each of display pixels is driven by the switching element independently. This active matrix method is mainly classified into two groups based on a kind of switching element to be used; one is a 2-terminal method using a diode and a 3-terminal method in which a thin film transistor element including an active layer and formed of amorphous silicon (a-Si) or polysilicon is used. Especially, since the liquid display device using the thin film transistor has a high resolution, a high aperture ratio and a high gradation display function, the image of high quality can be obtained (For example, see Japanese Laid Open Patent Disclosure (JP-A-Heisei 5-210116)).

Figure 1:
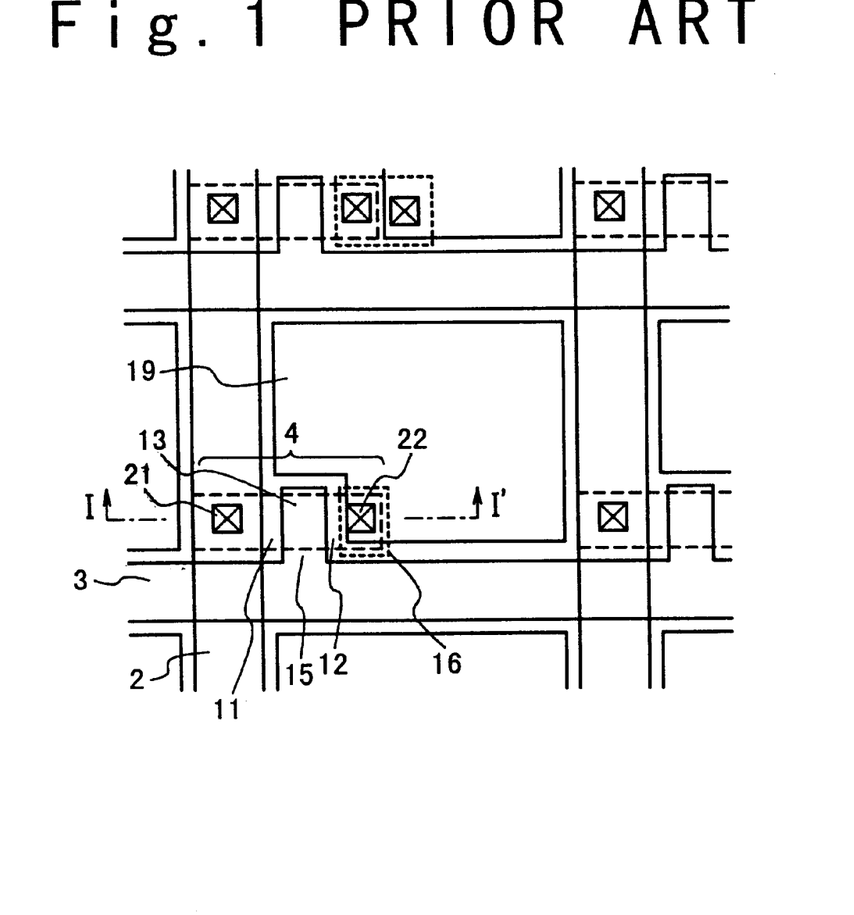
FIG. 1 is a plan view illustrating a unit pixel of an active matrix array substrate of a conventional example of liquid crystal device using thin film transistors of polysilicon.
Figure 2:
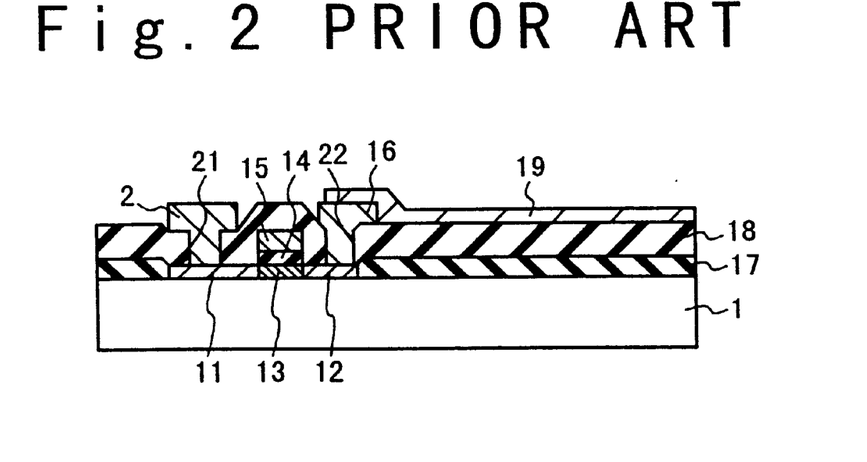
FIG. 2 is a cross sectional view of the unit pixel of the conventional example of the liquid crystal device taken along the line I-I' in FIG. 1.

FIG. 1 is a plan view illustrating unit pixels of an active matrix array substrate of a conventional liquid crystal device which uses a thin film transistor formed of polysilicon. FIG. 2 is a cross sectional view of a unit pixel of the thin film transistor taken along the line I-I' in FIG. 1. In the FIGS. 1 and 2, a reference numeral 1 denotes a quartz glass substrate. A reference numeral 2 denotes a data line which is composed of aluminum. The data line 2 is formed above the quartz glass substrate 1. A reference numeral 3 denotes a gate line which is composed of aluminum. The gate line 3 is provided to be orthogonal to the data line 2. A thin film transistor 4 is formed in correspondence to each of intersection points between the data lines 2 and the gate lines 3. Also, a reference numeral 11 is a source, 12 is a drain, and 13 is an active layer. A reference numeral 14 is a gate oxide film, 15 is a gate electrode, and 16 is a pad electrode which is composed of aluminum. A reference numeral 17 is a LOCOS film (Local Oxidation of Silicon film) which is formed on the quartz glass substrate 1. A reference numeral 18 is an interlayer insulating film which is composed of $SiO_2$ and which is formed on the LOCOS film 17. A reference numeral 19 is a transparent pixel electrode which is composed of or ITO (indium-tin-oxide) or $In_2O_3$ (indium oxide) in which Sn ions are doped. The transparent pixel electrode 19 is formed on the pad electrode 16 and the interlayer insulating film 18. The source 11 is electrically connected to the data line 2 and the drain 12 is electrically connected to the transparent pixel electrode 19 through the pad electrode 16. Note that reference numerals 21 and 22 are the first and second contact holes formed in the interlayer insulating film 18.

In the liquid crystal device, the thin film transistor 4 is selectively driven in response to a signal which is inputted from the gate line 3. The voltage to drive the liquid crystal is applied to the transparent pixel electrode 19 from the data line 2 when the thin film transistor 4 is in the on state. On the other hand, when the thin film transistor 4 is in the off state, a pixel potential is maintained by a pixel capacitance which is formed between the transparent pixel electrode 19 and a common electrode (not illustrated) which is formed on the second substrate opposing to the transparent pixel electrode, so that a display state is maintained.

Next, the manufacturing method of the above-mentioned liquid crystal device will be described with reference to FIGS. 3A to 3C.

Figure 3A:
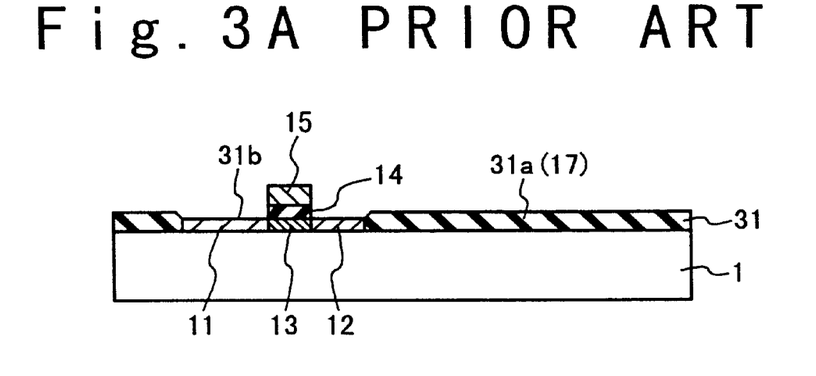
FIGS. 3A to 3C are cross sectional views illustrating a manufacturing process of the conventional example of liquid crystal device.

First, a semiconductor layer 31 which is composed of polysilicon on the quartz glass substrate 1 is formed as shown in FIG. 3A. A silicon nitride film is formed to cover a portion 31b of the semiconductor layer 31 where a thin film transistor is to be formed. A portion 31a of the semiconductor layer 31 which is not covered by the silicon nitride film is oxidized by annealing in oxygen ($O_2$) ambience to forms the LOCOS film 17.

Next, the silicon nitride film is removed. Subsequently, a gate oxide film 14 composed of $SiO_2$ is formed on the semiconductor layer portion 31b and then a gate electrode 15 which is composed of polysilicon and which contains P ions of about $10^{20}$ cm$^{-3}$ is formed. Then, the gate oxide film 14 and the gate electrode 15 are patterned. Subsequently, P ions of about $10^{20}$ cm$^{-3}$ are implanted in self-alignment with the gate electrode by an ion implantation method such that the P ions are doped in the area of the semiconductor layer portion 31b where the gate electrode 15 is not formed. As a result, the source 11 and the drain 12 are formed. The semiconductor layer portion 31b where the P ions are not implanted functions as the active layer 13.

Figure 3B:
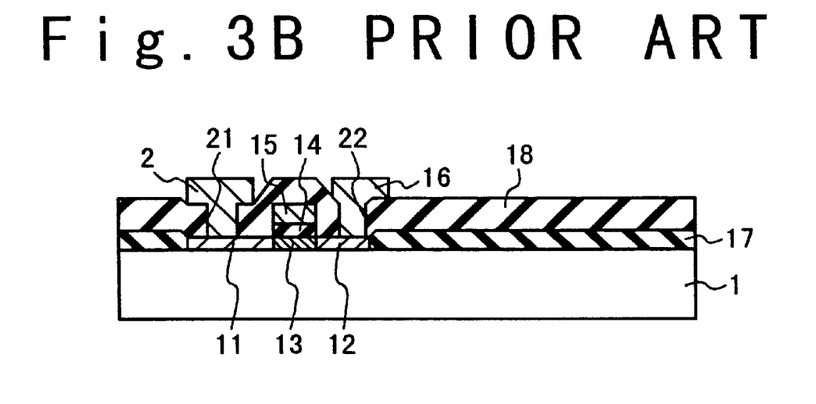
Figure 3C:
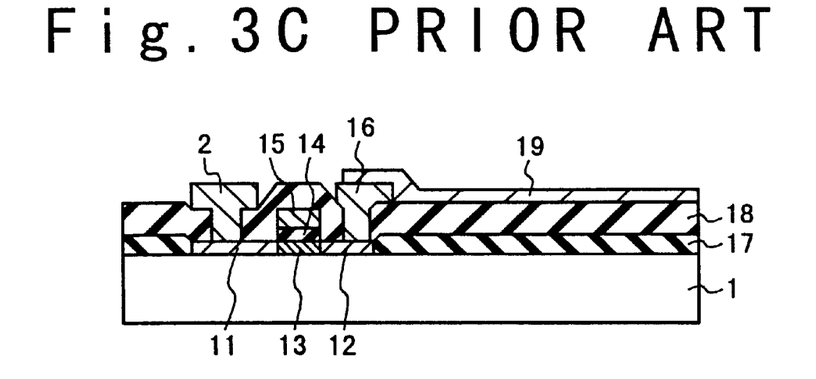

Next, as shown in FIG. 3B, the interlayer insulating film 18 is formed to cover the whole surface of the quartz glass substrate 1 on which the thin film transistor 4 is formed. Portions of the interlayer insulating film 18 above the source 11 and the drain 12 are removed by an etching method to forms the first contact hole 21 and the second contact hole 22, respectively. Subsequently, the data line 2 which is electrically connected to the source 11 and the pad electrode 16 which is electrically connected to the drain 12 are formed at the same time by a sputtering method Next, as shown in the same FIG. 3C, the transparent pixel electrode 19 is formed by the sputtering method in ambience of mixed gas of $O_2$ and Ar to cover a part of each of the pad electrodes 16 and the interlayer insulating films 18 is formed.

Thereafter, an orientating film is formed on the transparent pixel electrode 19 to perform orientation processing The second substrate on which a transparent electrode has been formed is arranged in such a manner that this transparent electrode opposes to the above-mentioned transparent pixel electrode 19. Subsequently, after these substrates are sealed, the liquid crystal is injected In this liquid crystal device, since the pad electrode 16 is formed between the drain 12 and the transparent pixel electrode 19, even if the interlayer insulating film 18 is formed between the drain 12 and the transparent pixel electrode 19 to have a thick thickness, it becomes possible to prevent the transparent pixel electrode 19 from being broken due to a step at the opening of the second contact hole 22.

On the other hand, as the structure which can prevent aluminum as electrode material from diffusing in silicon, there is widely known the structure in which a barrier metal film obtained by laminating a metal film of Ti and a film of Ti$_3$N$_4$ is formed between the aluminum electrode and the silicon substrate (see, for example, Japanese Laid Open Patent Disclosure (JP-A-Heisei 1-235334)).

Next, the method of forming the barrier metal film will be described with referring to FIGS. 4A to 4C.

Figure 4A:
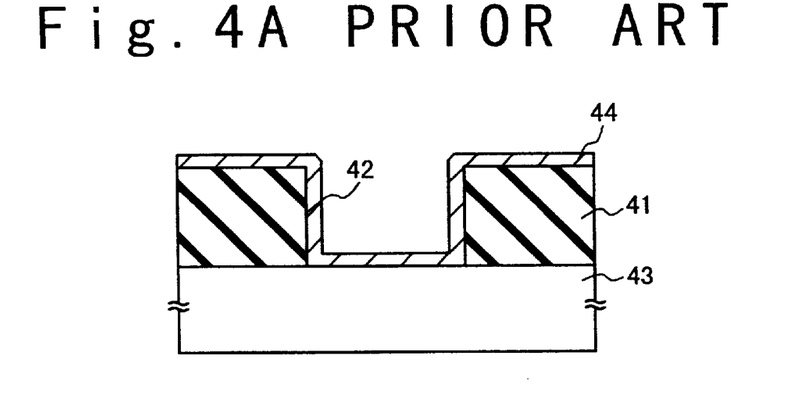
FIGS. 4A to 4C are cross sectional views illustrating a manufacturing process of forming a barrier metal film between the conventional aluminum electrode and a silicon substrate.

Firsts as shown in FIG. 4A, a titanium film 44 having the thickness of 20 nm is formed to have ohmic contact by a sputtering method on a silicon substrate 43 on which an insulating film 41 has been formed and moreover a contact hole 42 has been formed in the insulating film 41.

Figure 4B:
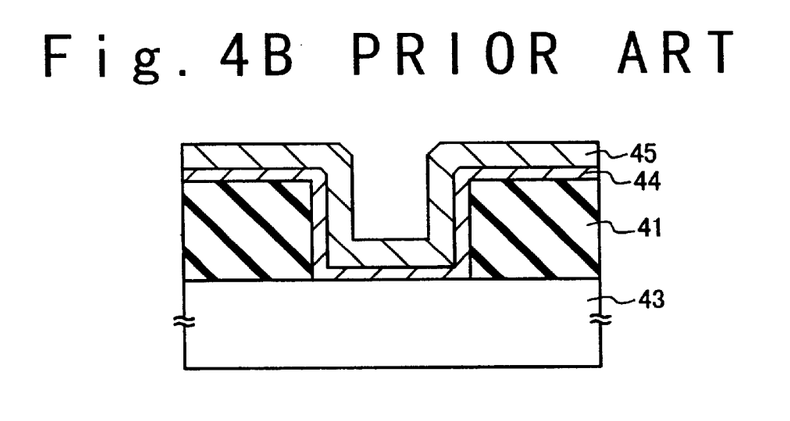

Next, as shown in FIG. 4B, a titanium nitride film 45 having the thickness of 80 nm is formed on the titanium film 44 using a reactive sputtering method by applying an RF (high frequency) substrate bias.

Figure 4C:
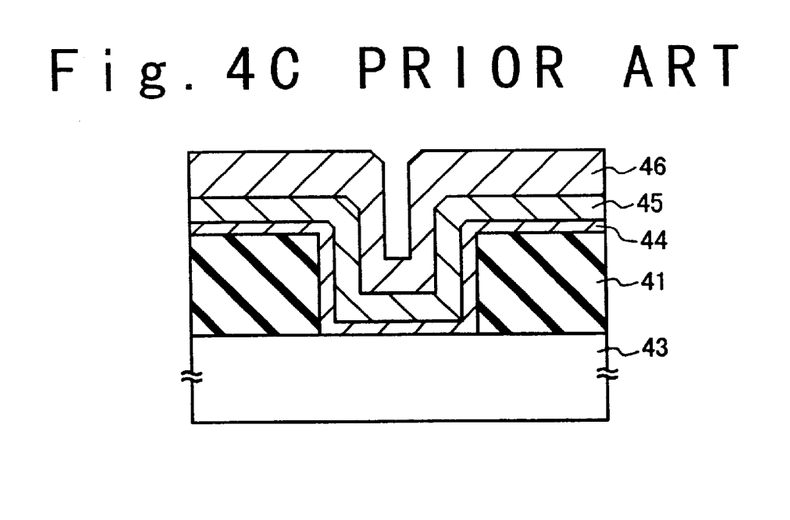

Next, as shown in FIG. 4C, an Al-Si alloy film 46 having the thickness of 600 nm is formed on the titanium nitride film 45 by the sputtering method.

In this way, by forming the barrier metal film which is composed of the lamination structure of the titanium film 44 and the titanium nitride film 45, the diffusion of aluminum (Al) to silicon (Si) can be prevented.

By the ways in the above-mentioned conventional liquid crystal device, there is a problem in that pixel defect is generated because the contact resistance between the transparent pixel electrode 19 and the pad electrode 16 becomes high. The reason is that because the formation of the transparent pixel electrode 19 is performed in a mixed gas ambience of O$_2$ and Ar, the oxide film is formed as a high resistance layer on the surface of the pad electrode 16, resulting in the high contact resistance. If this contact resistance becomes high, even if the thin film transistor 4 is set to the ON state, a voltage drop is caused by the contact section between the transparent pixel electrode 19 and the pad electrode 16 so that it becomes not possible to write data in the transparent pixel electrode 19.

On the other hand, in the structure in which the barrier metal film is formed, when the barrier metal film is formed between the aluminum electrode and the transparent electrode, there is a problem in that the contact resistance between the barrier metal film and the transparent electrode becomes high. The reason is that the barrier metal film and the transparent electrode can not be continuously formed because the plane pattern shape of the barrier metal and that of the transparent electrode are different from each other. Accordingly, after the barrier metal film is formed, the wafer is necessarily exposed to atmosphere so that the barrier metal film surface is oxidized. Also, because the titanium nitride film 45 has the cylindrical structure, O$_2$ is taken into the grain boundary when the titanium nitride film 45 is exposed to the atmosphere. Generally, the method in which the titanium nitride film 45 is exposed to the atmosphere to take O$_2$ into the grain boundary is a very useful method because it becomes possible to prevent aluminum from diffusing along the grain boundary. However, there is a problem in that the contact resistance increases because the titanium nitride film 45 becomes high resistance.

SUMMARY OF THE INVENTION

The present invention is made in the light of the above-mentioned circumstances. Therefore, an object of the present invention is to provide a semiconductor device and a manufacturing method for the same in which contact resistance between a transparent electrode and a pad electrode can be decreased.

In order to achieve an aspect of the present invention, a semiconductor device includes a semiconductor region, an insulating film formed on the semiconductor region and having a contact hole extending to the semiconductor region, an electrically conductive metal layer for filling the contact hole, an electrically conductive protection layer formed on the metal layer to prevent oxidation of the metal layer during manufacturing of the semiconductor device, material of the protection layer being more difficult to be oxidized than aluminum, and a transparent electrode formed on the protection layer such that the wiring layer is electrically connected to the semiconductor region. The metal layer and the protection layer have the same planer pattern.

The semiconductor device is a thin film transistor and the semiconductor region is formed on a glass substrate. The metal layer may be formed of aluminum. In this case, when the semiconductor region is formed of silicon, a migration preventing layer is desirably disposed between the metal layer and the semiconductor region to prevent migration of aluminum into the semiconductor region. The protection layer may be formed of titanium or a laminate layer of a titanium layer and a titanium nitride layer.

In order to achieve another aspect of the present invention, a thin film transistor includes a glass substrate, a semiconductor region formed on the glass substrates an insulating film formed on the semiconductor region and having a contact hole extending to the semiconductor regions an electrically conductive metal layer composed of aluminum, for filling the contact holes an electrically conductive protection layer formed on the metal layer to prevent oxidation of the metal layer during manufacturing of the semiconductor device, material of the protection layer is more difficult to be oxidized than aluminum, and an ITO layer formed on the protection layer in an ambience including oxygen such that the ITO layer is electrically connected to the semiconductor region.

In order to achieve still another aspect of the present invention, a method of manufacturing a semiconductor device, includes the steps of:

forming a semiconductor region;

forming an insulating film on the semiconductor region;

forming a contact hole extending to the semiconductor region;

filling the contact hole with an electrically conductive metal layer;

forming an electrically conductive protection layer on the metal layer to prevent oxidation of the metal layer, wherein material of the protection layer is more difficult to be oxidized than aluminum; and forming an ITO layer on the protection layer in an ambience including oxygen such that the ITO layer is electrically connected to the semiconductor region.

In order to achieve yet still another aspect of the present invention, a method of manufacturing a semiconductor device, includes the steps of:

forming a semiconductor region on a glass substrate;

forming an insulating film on the semiconductor region;

forming a contact hole extending to the semiconductor region;

filling the contact hole with an electrically conductive metal layer of aluminum;

forming an electrically conductive protection layer on the metal layer to prevent oxidation of the metal layer, wherein material of the protection layer is more difficult to be oxidized than aluminum;

etching a surface of the protection layer; and forming a transparent electrode on the protection layer such that the transparent electrode is electrically connected to the semiconductor region.

DESCRIPTION OF THE PREFERRED EMBODIMENTS

The semiconductor device of the present invention will be described below in detail with reference to the attachment drawings.

Figure 5:
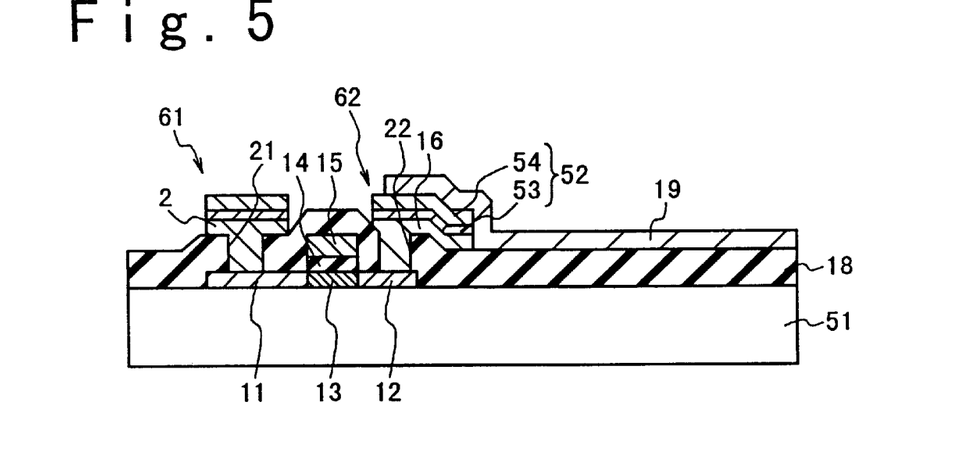
FIG. 5 is a cross sectional view illustrating a unit pixel of an active matrix array substrate of a liquid crystal device according to the first embodiment of the present invention.

The semiconductor device according to the embodiment of the present invention will be described. FIG. 5 is a cross sectional view illustrating a unit pixel of an active matrix array substrate of an liquid crystal device using a semiconductor switching device such as a thin film transistors of polysilicon. Referring to FIG. 5, a glass substrate 51 does not almost contain alkaline metal ion. A laminate layer 52 is a layer formed by laminating a metal layer 53 of Ti and a nitride layer 54 of TiN.

The surface of the TiN layer 54 is etched by an RF (high frequency) bias sputtering method. In the liquid crystal devices because the surface of the TiN layer 54 is etched by the bias sputtering method so that an oxidation layer formed on the surface of the TiN layer 54 between a pad electrode 16 and a transparent pixel electrode 19 is removed by the etching, the laminate layer 52 has a low resistance. Therefore, the contact resistance between the pad electrode 16 and the transparent pixel electrode 19 is decreased.

Next, the manufacturing method of the liquid crystal device will be described with reference to FIGS. 6A to 6C.

Figure 6A:
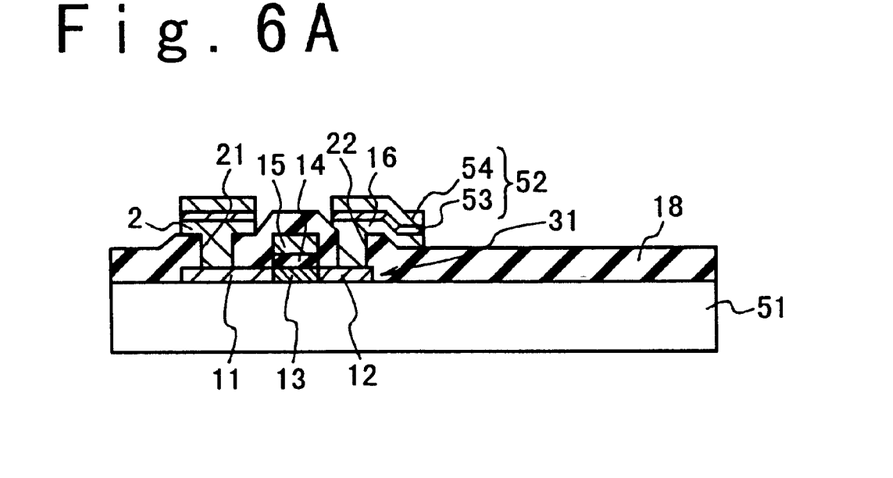
FIGS. 6A to 6C are cross sectional views illustrating a manufacturing process of the liquid crystal device according to the embodiment of the present invention.

First, as shown in FIG. 6A, on the glass substrate 51 is formed a semiconductor layer 31 with the 100-nm thickness which is composed of amorphous silicon, by a decompression vapor deposition method using $Si_2H_6$. The semiconductor layer 31 is annealed in nitrogen ($N_2$) ambience such that the semiconductor layer 31 is crystallized into a layer of polysilicon.

Next, after the semiconductor layer 31 is patterned to have an island shape, a gate oxide film 14 of $SiO_2$ is formed on the patterned semiconductor layer 31 to have the thickness of 100 nm, by the decompression vapor deposition method using $SiH_4$ and $O_2$. Subsequently, a gate electrode 15 is formed on the gate oxide film 14 by the decompression vapor deposition method using $SiH_4$ and $PH_3$. The gate electrode 15 has the thickness of 200 nm and is composed of polysilicon which contains P ions of about $10^{20}$ cm$^{-3}$.

Next, P ions of about $10^{20}$ cm$^{-3}$ are injected by an ion implantation method in a region of the patterned semiconductor layer 31 where the gate electrode 15 is not formed. As a result, a source 11 and a drain 12 are formed. A region of the patterned semiconductor layer 31 where the gate electrode 15 is formed and the P ions are not implanted functions as an active layer 13.

Next, By a plasma CVD method, an interlayer insulating film 18 having the 300-nm thickness and composed of $SiO_2$ is formed to cover the whole surface of glass substrate 51 on which the source 11 the drain 12 and so on are formed. Subsequently, a part of the interlayer insulating film 18 on each of the source 11 and the drain 12 is removed by an etching method such that a first contact hole 21 and a second contact hole 22 are formed.

Next, by a sputtering method, an aluminum (Al) film, a metal film of Ti and a nitride film of TiN are continuously formed to have the thicknesses 500 nm, 20 nm, and 80 nm, respectively with out exposing the substrate to the atmosphere. The aluminum (Al) film, the metal film of Ti and the nitride film of TiN are patterned at the same time to form a data line section 61 and the pad electrode 16. As a result, the data line section 61 is formed to connect to the source 11 through the first contact hole 21. At the same time, the pad electrode section 62 is also formed to connect to the drain 12 through the second contact hole 22. In this case, each of the data line section 61 and the pad electrode section 62 has a 3-layer structure of Al/Ti/TiN, because the laminate layer 52 composed of the metal layer 53 of Ti and the nitride layer 54 of TiN is unitarily formed on the surface of the data line 2 or the pad electrode 16. It is desirable that the 3-layer structure is continuously formed in the same chamber without exposing the substrate to the atmosphere. This is because the surface of the Al layer is oxidized such that an oxide film of $Al_2O_3$ is formed to have a high resistance when the substrate is exposed to the atmosphere. That is, the laminate layer 52 prevents the oxidation of the metal layer of aluminum.

Figure 6B:
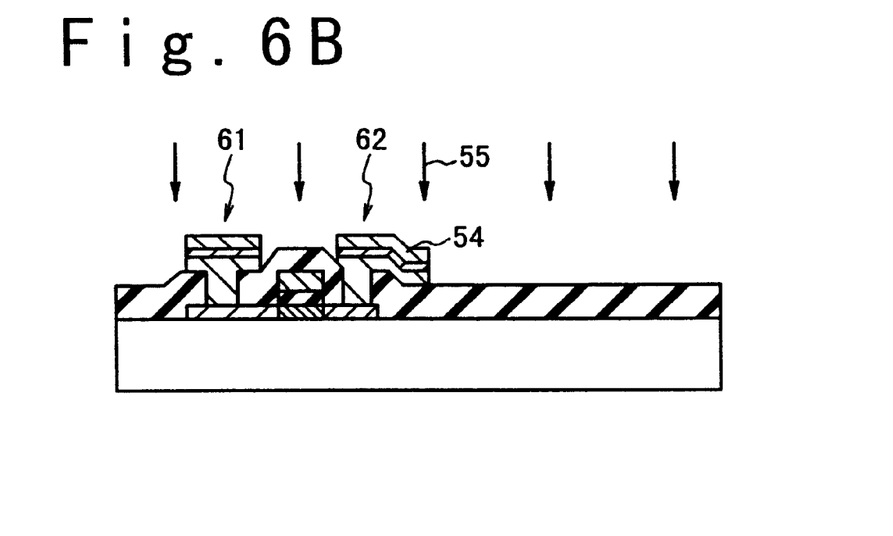

Next, as shown in FIG. 6B, an RF (high frequency) bias sputtering is performed in ambience of Ar plasma 55 to etch the surface of the nitride layer 54 of TiN by about 20 nm. As a result, even if an oxide film is formed on the surface of the nitride layer 54 of TiN when the substrate is exposed to the atmosphere in order to form an ITO layer later, the oxide film on the surface of the nitride layer 54 can be removed. For this reason, the nitride layer 54 is desirably formed of material which is more difficult to be oxidized than aluminum.

Figure 6C:
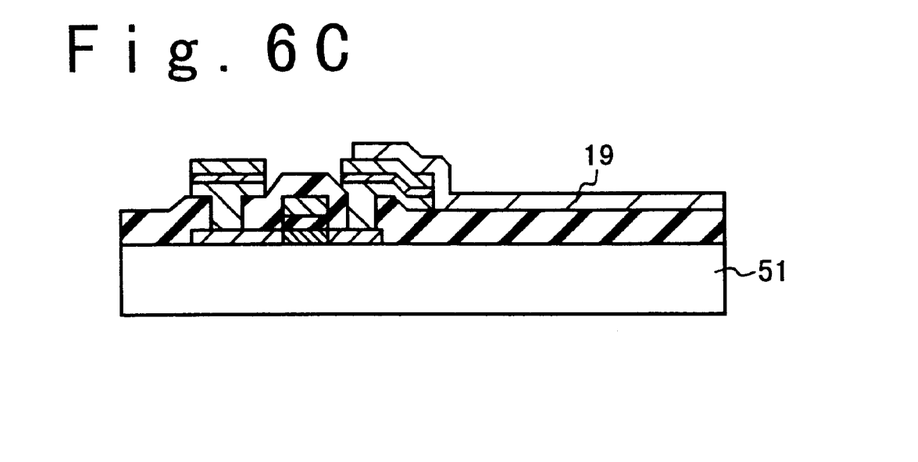

Next, as shown in FIG. 6C, a transparent pixel electrode 19 of ITO having the thickness of 75 nm is continually formed by the sputtering method in a mixed gas ambience of $O_2$ and Ar without exposing the surface of the nitride layer 54 of TiN to the atmosphere. It is desirable that the transparent pixel electrode 19 has the thickness in a range of about 50 to 150 nm. When the film thickness is thicker than the above thickness, the transmissivity of the pixel electrode 19 decreases, and when the film thickness is thinner than the above thickness, the resistance value of the pixel electrode 19 increases. Also, because the ITO pixel electrode 19 is formed in the ambience including oxygen, the nitride layer 54 of the laminate layer 52 is desirably difficult to be oxidized in this viewpoint.

Thereafter, an orientating film is formed on the transparent pixel electrode 19 to perform orientation processing. Then, another substrate on which a transparent electrode has been formed is arranged such that the transparent electrode opposes to the transparent pixel electrode 19. Subsequently, liquid crystal is poured after these substrates are sealed.

Figure 7:
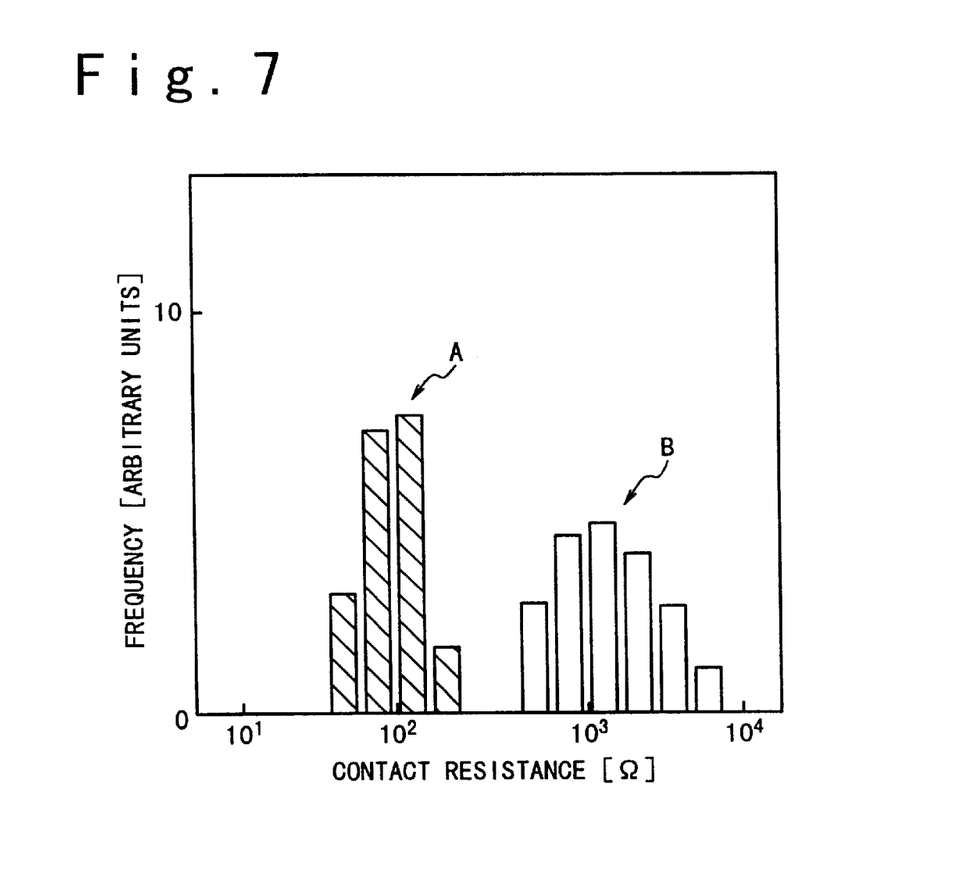
FIG. 7 is a histogram illustrating the measurement results of contact resistance in the liquid crystal device according to the embodiment of the present invention and contact resistance of the conventional example of liquid crystal device.

FIG. 7 is a histogram illustrating the measurement result of contact resistance in the liquid crystal device (A) of the present invention and that of contact resistance in the conventional example of liquid crystal device (B). Here, each of the first and second contact holes 21 and 22 is formed to have an area of 3 $\mu$m×3$\mu$m.

According to these measurement results, the average contact resistance of the conventional example of liquid crystal device is $2.5\times10^3$ $\Omega$, whereas, the average contact resistance of the liquid crystal device of the present invention is 80 $\Omega$. Thus, it could be understood that the average contact resistance in the present invention decreases to a value equal to or less than 1/30 of that in the conventional example of liquid crystal device. The reason is that the surface of pad electrode 16 is never oxidized when the transparent pixel electrode is formed because the laminate layer 52 of the low resistance composed of the metal layer 53 Ti and the nitride layer 54 of TiN is formed between the pad electrode 16 and the transparent pixel electrode 19. Therefore, the $Al_2O_3$ film of high resistance is not formed on the surface of pad electrode 16.

Figure 8:
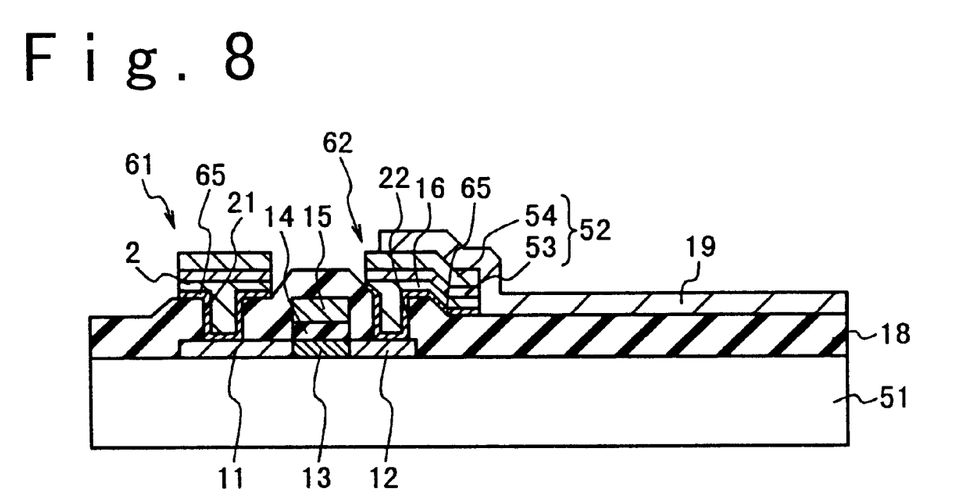
FIG. 8 is a cross sectional view illustrating a unit pixel of an active matrix array substrate of a liquid crystal device according to the second embodiment of the present invention.

Next, the liquid crystal display device according to the second embodiment of the present invention will be described with reference to FIG. 8. Referring to FIG. 8, in the second embodiment, a migration preventing layer 65 is provided between the data line 2 and the source 11 and between the pad electrode and the drain 12. The migration preventing 65 is formed in the same manner in the conventional example shown in FIGS. 4A to 4C. Thus, it can be prevented to aluminum diffusing into the source 11 and drain 12 composed of silicon.

As described above, according to the liquid crystal device of the present invention, a laminate layer 52 of low resistance is formed between the pad electrode 16 and the transparent pixel electrode 19 by laminating the metal layer 53 of Ti and the nitride layer 54 of TiN. Also, the surface of the nitride layer 54 of TiN is etched by the RF bias sputtering method before the ITO layer 19 is formed. Therefore, the multi-layer wiring structure composed of Al/Ti/TiN/ITO can be formed so that the contact resistance between the drain 12 and the transparent pixel electrode 19 can be decreased.

Also, according to the manufacturing method of liquid crystal device of this invention, the surface of the nitride layer 54 of TiN is etched by the RF bias sputtering method and then the transparent pixel electrode 19 is continuously formed on the nitride layer 54 without exposing the nitride layer 54 surface to the atmosphere. Therefore, the pad electrode 16 is protected by the laminate layer 52 of the low resistance to prevent oxidation of the pad electrode 16. Also, because an oxide film in the surface of the nitride layer 54 of TiN is removed, the nitride layer 54 itself is maintained in the low resistance, resulting in prevention of increase of the contact resistance between the pad electrode 16 and the transparent pixel electrode 19.

Further, according to the present invention, the laminate layer 52 composed of the metal layer 53 of Ti and the nitride layer 54 of TiN is patterned to have the same pattern as that of the pad electrode 16. Also, because the titanium nitride layer 54 can function as a reflection preventing film which is used in a photo-lithography process, it is not necessary to form a Si film which is generally used as the reflection preventing film. Therefore, the number of processes increases hardly.

In the above embodiments, aluminum (Al) is used as material of the pad electrode 16. However, the similar effect can be achieved even if another metal other than aluminum, e.g., tungsten (W) is used. Also, this Al layer may contain a few % of Si. By adding Si, the diffusion of aluminum (Al) to the source 11 and the drain 12 can be restrained. In addition, in the above embodiments, the liquid crystal device using a thin film transistor of the polysilicon is described. However, the same effect can be achieved even in case of a liquid crystal device using a thin film transistor of amorphous Si, or a metal-insulator-metal (MIM) diode or liquid crystal device of the simple matrix Further, when the present invention is applied to the devices other than the liquid crystal device e.g., another kind of device which uses a transparent electrode such as the image sensor, the similar effect can be achieved.

What is claimed is:

1. A semiconductor device comprising:

a semiconductor region;

an insulating film formed on said semiconductor region and having a contact hole extending to said semiconductor region;

an electrically conductive metal layer for filling said contact hole;

an electrically conductive protection layer formed on said metal layer to prevent oxidation of said metal layer during manufacturing of said semiconductor device, wherein material of said protection layer is more difficult to be oxidized than aluminum and is formed of a laminate layer which includes a titanium layer and a titanium nitride layer, said metal layer and said protection layer being patterned to have a same pattern; and a transparent electrode formed on said protection layer such that a wiring layer is electrically connected to said semiconductor region.

2. A semiconductor device according to claim 1, wherein said semiconductor device is a thin film transistor and said semiconductor region is formed on a glass substrate.

3. A semiconductor device according to claim 1, wherein said metal layer is formed of aluminum.

4. A semiconductor device according to claim 1, wherein said protection layer is formed of titanium.

5. A semiconductor device according to claim 1, wherein said titanium nitride layer has a top surface which does not include an oxide layer.

6. A semiconductor device according to claim 3, wherein said semiconductor region is formed of silicon and said semiconductor device further comprises a migration preventing layer disposed between said metal layer and said semiconductor region to prevent migration of aluminum into said semiconductor region.

7. A thin film transistor comprising:

a glass substrate;

a semiconductor region formed on said glass substrate;

an insulating film formed on said semiconductor region and having a contact hole extending to said semiconductor region;

an electrically conductive metal layer composed of aluminum, for filing said contact hole;

an electrically conductive protection layer formed on said metal layer to prevent oxidation of said metal layer during manufacturing of said semiconductor device, wherein material of said protection layer is more difficult to be oxidized than aluminum and is formed of a laminate layer which includes a titanium layer and a titanium nitride layer, said metal layer and said protection layer being patterned to have a same pattern; and an ITO layer formed on said protection layer in an ambience including oxygen such that said ITO layer is electrically connected to said semiconductor region.

8. A thin film transistor according to claim 7, wherein said semiconductor region is formed of silicon and said semiconductor device further comprises a migration preventing layer disposed between said metal layer and said semiconductor region to prevent migration of aluminum into said semiconductor region.

9. A thin film transistor according to claim 7, wherein said protection layer is formed of titanium.

10. A thin film transistor according to claim 6, wherein said titanium nitride layer has a top surface which does not include an oxide layer.

* * * * *